United States Patent
Leder et al.

(10) Patent No.: US 10,839,124 B1
(45) Date of Patent: Nov. 17, 2020

(54) INTERACTIVE COMPILATION OF SOFTWARE TO A HARDWARE LANGUAGE TO SATISFY FORMAL VERIFICATION CONSTRAINTS

(71) Applicant: Amazon Technologies, Inc., Seattle, WA (US)

(72) Inventors: Uri Leder, Lotem (IL); Adi Habusha, Lotem (IL); Ofer Naaman, Hod Hasharon (IL); Tzachi Zidenberg, Kiryat Tivon (IL); Ohad Gdalyahu, Haifa (IL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/454,035

(22) Filed: Jun. 26, 2019

(51) Int. Cl.
*G06F 30/00* (2020.01)
*G06F 30/3323* (2020.01)
*G06F 30/30* (2020.01)
*G06F 30/33* (2020.01)

(52) U.S. Cl.
CPC .......... *G06F 30/3323* (2020.01); *G06F 30/30* (2020.01); *G06F 30/33* (2020.01)

(58) Field of Classification Search
CPC ....... G06F 30/3323; G06F 30/33; G06F 30/30
See application file for complete search history.

(56) References Cited

U.S. PATENT DOCUMENTS

| | | | |
|---|---|---|---|
| 6,209,120 B1 | 3/2001 | Kurshan et al. | |
| 6,295,515 B1 * | 9/2001 | Kurshan | G06F 30/3323 703/13 |
| 6,848,085 B2 | 1/2005 | Panchul et al. | |
| 7,328,195 B2 * | 2/2008 | Willis | G06F 30/367 706/14 |
| 7,386,818 B2 * | 6/2008 | Ganai | G06F 30/3323 716/107 |
| 7,483,823 B2 * | 1/2009 | Alfieri | G06F 30/30 703/14 |
| 8,453,083 B2 | 5/2013 | Hiraoglu et al. | |
| 8,707,278 B2 * | 4/2014 | Balakrishnan | G06F 8/24 717/136 |
| 8,726,241 B1 * | 5/2014 | Limondin | G06F 30/30 717/126 |
| 8,943,448 B2 * | 1/2015 | Alfieri | G06F 30/327 716/106 |
| 2005/0289485 A1 * | 12/2005 | Willis | G01R 31/318364 716/104 |
| 2019/0095566 A1 * | 3/2019 | Denisenko | G06F 8/427 |

* cited by examiner

*Primary Examiner* — Naum Levin
(74) *Attorney, Agent, or Firm* — Robert C. Kowert; Kowert, Hood, Munyon, Rankin & Goetzel, P.C.

(57) ABSTRACT

Interactive compilation of software to a hardware language may be performed to satisfy formal verification constraints. Source code for software to be executed on a hardware design may be received. Intermediate code may be generated from the source code as part of translating the source code to a hardware language used to specify the hardware design. The intermediate code may be provided via an interface and updates to the intermediate code may be received. The updated source code may then be used to complete translation of the source code to the hardware language.

20 Claims, 8 Drawing Sheets

FIG. 5 software source code 510

```
if (physical_interrupt)
gic_write_vmcr_el2(0);
wait 3;
irqnr = gic_read_iar();
if (physical_interrupt)
gic_write_vmcr_el2(32'h0,5'h1f, 23'h0, 1'b0, 2'h2);
if (likely(irqnr > 15 && irqnr < 1020) || irqnr >= 8192)
if (static_branch_likely(&supports_deactivate_key))
    gic_write_eoir(irqnr);
if (err) {
    if (static_branch_likely(&supports_deactivate_key)) {
        if (irqnr < 8192)
            gic_write_dir(irqnr);
    } else { gic_write_eoir(irqnr);
if (irqnr < 16) {
    gic_write_eoir(irqnr);
    if (static_branch_likely(&supports_deactivate_key))
        gic_write_dir(irqnr);
```

→ generate intermediate code 520 intermediate assembly code 530

```
0   STARTPROGRAM
1   if(physical_int)
2   write ICH_VMCR_EL2.VENG1 0
3   wait 3
4   irqnr = gic_read_iar();
5
6   if(physical_int)
7   write ICH_VMCR_EL2.VENG1 1
8   if (likely(irqnr > 15 && irqnr < 1020) || irqnr >= 8192))
9   if (static_branch_likely(EOI_and_DIR_are_separated)) {
10      gic_write_eoir(irqnr);
11  if (err)
12  if (static_branch_likely(EOI_and_DIR_are_separated && (irqnr<8192 || CVOS_mode))
13      if (irqnr < 8192 || CVOS_mode)
14          gic_write_dir(irqnr);
15      else gic_write_eoir(irqnr);
16  else if (EOI_and_DIR_are_separated)
17      gic_write_dir(irqnr);
18  else if(!EOI_and_DIR_are_separated)
19          gic_write_eoir(irqnr);
20  if (irqnr < 16) {
21      gic_write_eoir(irqnr);
22  if (static_branch_likely(EOI_and_DIR_are_separated))
23      gic_write_dir(irqnr);
24  ENDOFPROGRAM
```

INTERACTIVE COMPILATION OF SOFTWARE TO A HARDWARE LANGUAGE TO SATISFY FORMAL VERIFICATION CONSTRAINTS

BACKGROUND

Formal verification provides a cost effective design tool when implementing different hardware solutions. A formal verification system may generate a mathematical model or representation of a hardware design, then determine whether a proof exists or can be generated that solves the mathematical model (e.g., by providing a proof to demonstrate correctness of a finite state machine). If a proof exists, then it can be assured that the hardware design is logically sound (although further testing for physical implementation features, such as component layout to account for On-Chip Variation and other physically occurring conditions may still be performed). In this way, problems in the hardware design can be identified without building the hardware design first. Techniques that can increase the utilization of formal verification systems may reduce design and development costs, decrease the number of undetected bugs, errors, or design flaws, and thus such techniques may be highly desirable.

BRIEF DESCRIPTION OF THE DRAWINGS

FIG. 5 is an example of a translation from a source code of software to an intermediate code version of the software code, according to some embodiments.

Figure 1:
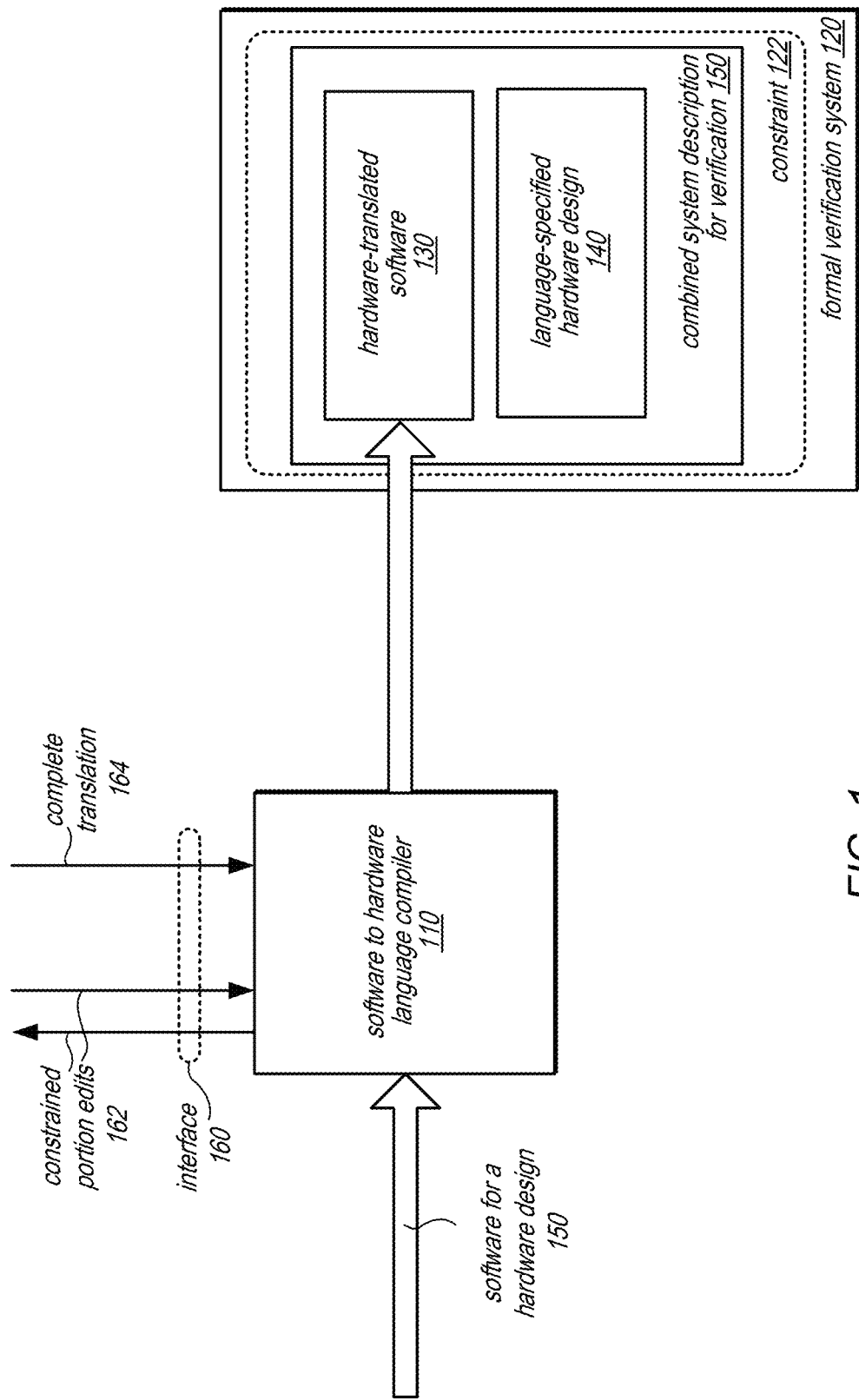
FIG. 1 illustrates a logical block diagram of interactive compilation of software to a hardware language to satisfy formal verification constraints, according to some embodiments.

While embodiments are described herein by way of example for several embodiments and illustrative drawings, those skilled in the art will recognize that the embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. As used throughout this application, the word "may" is used in a permissive sense (i.e., meaning having the potential to), rather than the mandatory sense (i.e., meaning must). Similarly, the words "include", "including", and "includes" mean including, but not limited to.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, paragraph (f), for that unit/circuit/component. Additionally, "configured to" can include generic structure (e.g., generic circuitry) that is manipulated by software or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On" or "Dependent On." As used herein, these terms are used to describe one or more factors that affect a determination. These terms do not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

DETAILED DESCRIPTION

Various techniques of interactive compilation of software to a hardware language to satisfy formal verification constraints are described herein. When developing some types of technological devices, software that executes upon hardware designs may be tightly integrated with and specific to the hardware design, as is the case with embedded software. While different formal verification systems may be used to test the hardware and software individually, the integrated performance of both the software as it is performed by the hardware design may provoke other design flaws, bugs, or errors that may not be apparent if verified individually. Instead of performing formal verification individually on hardware designs and software, in some embodiments, both the hardware and software may be verified together as part of a single job, task, or process, by one formal verification system. In this way, problems related to the integration or interactions between the hardware design and software can be identified and solved and performance improvement opportunities discovered for the combined working of the software and hardware design.

Given the nature of the analysis, formal verification systems may be limited in the size, features, or other aspects of submitted software and hardware combinations, as the modeling and solution finding tasks of the formal verification system may quickly outpace the time and processing capabilities of the formal verification system to handle the size, features, or other aspects of the submitted software and hardware combinations (e.g., modeling larger systems may become computationally complex or costly). To perform formal verification on both the software and hardware together, the source code of the software may be translated into a hardware language, treating the software like another module (e.g., a specially designed CPU) that interacts with the hardware design, in some embodiments. Interactive compilation of software to a hardware language to satisfy formal verification constraints may be implemented in order to avoid software translations that would prevent formal verification from being performed due to the combined exceeding a constraint of the formal verification system, in some embodiments.

FIG. 1 illustrates a logical block diagram of interactive compilation of software to a hardware language to satisfy formal verification constraints, according to some embodiments. Formal verification system 120 may perform formal verification techniques on a submitted system described according to a hardware language (e.g., such as hardware description languages like VHDL, Verilog, and RHDL, among others). Formal verification system 120 may impose constraints 122 upon systems to be verified, which may represent unsupported features or conditions that may cause formal verification system 120 to become inoperable if the combined system description 150 of hardware-translated software 130 and language specified hardware design 140 does not satisfy constraint 122. For example, a constraint 122 may be a size constraint for the combined hardware and software (e.g., defined in terms of storage space, number of lines, or resource utilization when attempting to perform the verification, such as a scenario where the formal verification is unable to complete because of a lack of memory), in some embodiments. The constraint 122 may be a feature, function, data structure or model implemented as part of the software, which may not be supported by formal verification system 120, in some embodiments. Although one constraint 122 is illustrated in FIG. 1, multiple constraints (e.g., various combinations of the constraints identified above) may be applicable to the formal verification of hardware and software together and thus may be evaluated for edits to satisfy the constraints, in some embodiments.

Software to hardware language compiler 110 may implement various techniques, discussed in detail below with regard to FIGS. 2-7, to translate software for a hardware design 150 into a translation of the software specified in hardware language 130 that fits within the constraint 122 when considered together with language specified hardware design 140. As illustrated in FIG. 1, an interface 160 (e.g., a programmatic interface, command line interface, and/or Graphical User Interface (GUI)) may be implemented to receive edits 162 to portions of the software in order to reduce or ensure that the translated software fits within the constraint 122. For example, updates may be made to reduce the of portions of code by replacing a portion of intermediate code (e.g., assembly language) with a different portion of code that utilizes less space or does not invoke other features to be added to the translated code in order to make the replaced portion of code operate.

For instance, a function invocation in the code may implicate a library or other set of operations to implement the function invocation, not all of which may be necessary to achieve the desired operation (e.g., an operation may support many different parameters but the software code may only utilize one of the parameters). Instead of using the implementing code for the function obtained from a library or other specification that incorporates the unneeded features, a simpler or smaller implementation tailored narrowly to the use of the function in the software (e.g., only supporting the one parameters) may be implemented by an edit 162, reducing (or preventing) the generated version of translated code from not satisfying a constraint 122 (e.g., preventing the generated version of the translated code from exceeding a size constraint).

Figure 7:
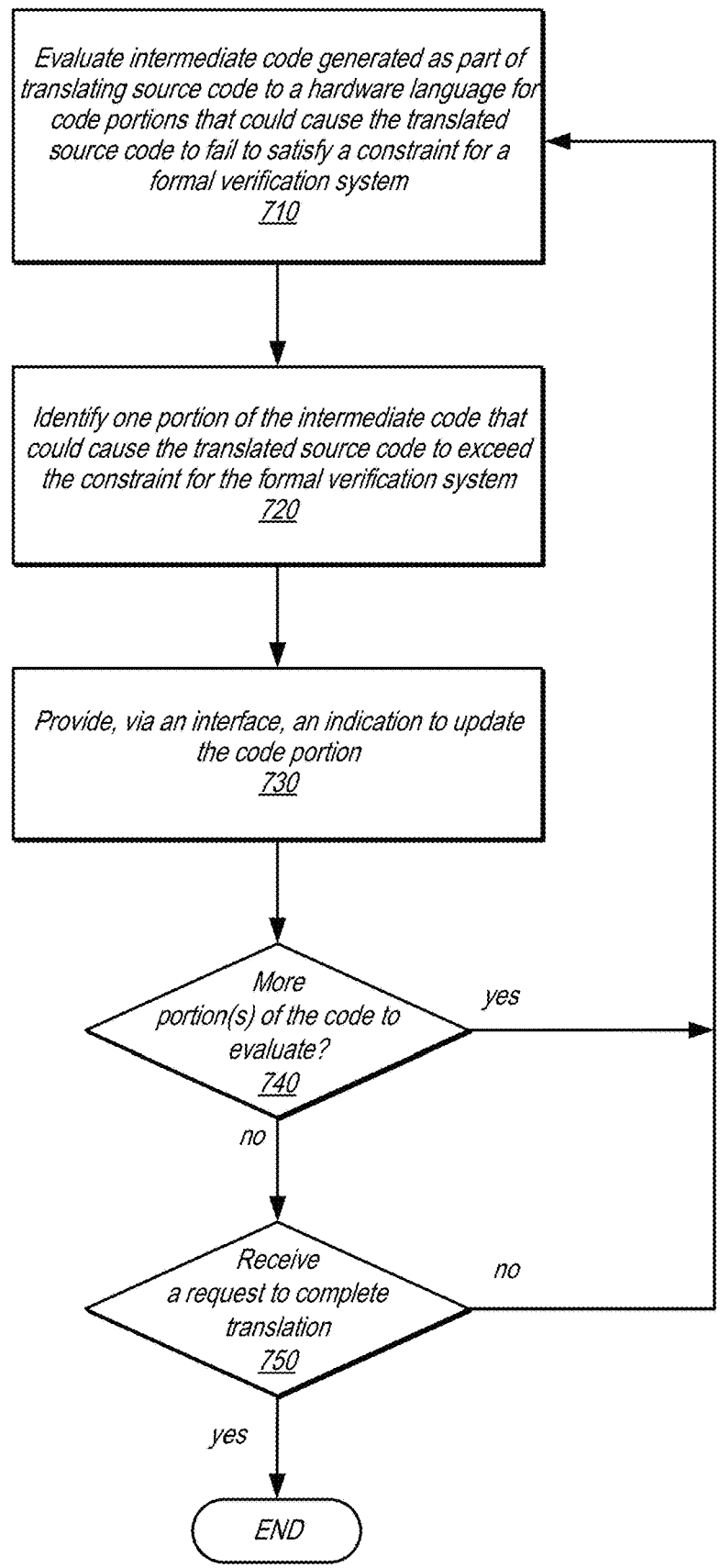
FIG. 7 is a high-level flowchart illustrating various methods and techniques to provide indications of code portions to update via an interface, according to some embodiments.

Such edits 162 may be performed in response to prompts or other indications, which may also be received and answered via interface 160, in some embodiments, as discussed below with regard to FIGS. 4 and 7. A request to complete translation 164 may be received at software to hardware language compiler 110 in order to finalize the translation inclusive of or using the updates made via edits 162. This translated code may then be incorporated as part of a combined system description for verification 150 that includes both hardware translated software 130 and language-specified hardware design to be analyzed by formal verification system 120.

Please note that the previous description of a compiler 110, formal verification system 120, interface 160, edits 162, and/or constraint 122 are merely provided as an examples of interactive compilation of software to a hardware language to satisfy formal verification constraints. Different numbers of components or configuration of components may be implemented.

This specification begins with general descriptions of a development application, which may implement interactive compilation of software to a hardware language to satisfy formal verification constraints. Various examples of different components/modules, or arrangements of components/modules that may be implemented in the development application may then be discussed. A number of different methods and techniques to implement interactive compilation of software to a hardware language to satisfy formal verification constraints are then discussed, some of which are illustrated in accompanying flowcharts. Various examples are provided throughout the specification.

Figure 2:
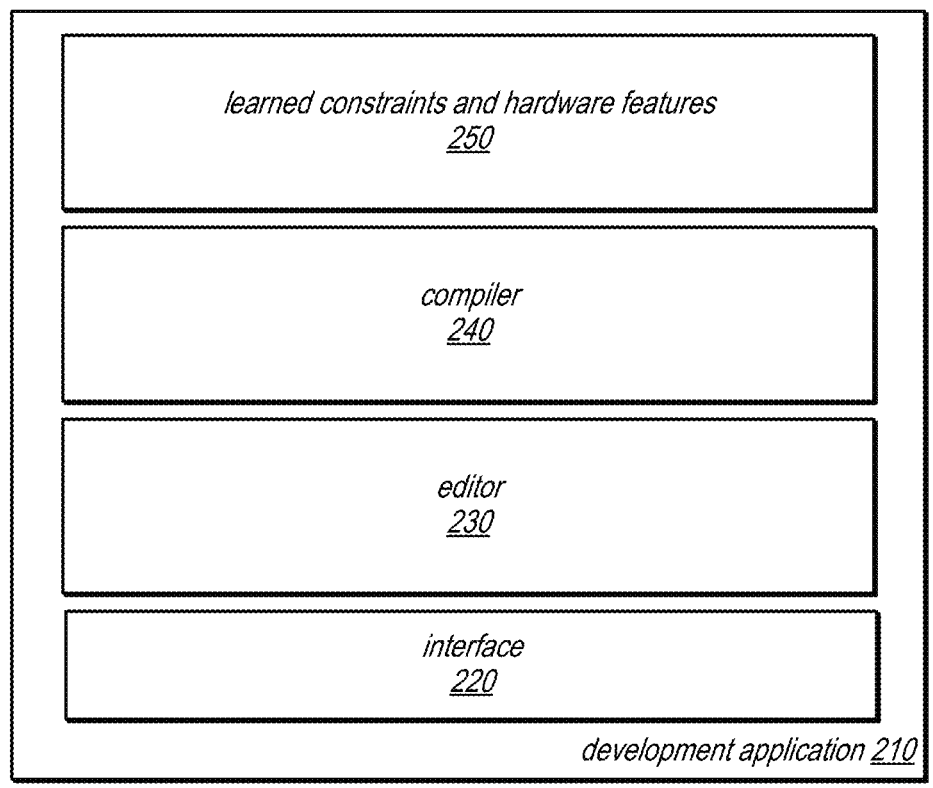
FIG. 2 is a logical block diagram illustrating a development application that may implement interactive compilation of software to a hardware language to satisfy formal verification constraints, according to some embodiments.

FIG. 2 is a logical block diagram illustrating a development application that may implement interactive compilation of software to a hardware language to satisfy formal verification constraints, according to some embodiments. Development application 210 may provide a set of development tools or functions (as may be found in an Integrated Development Environment (IDE)) to perform, among other operations, the compilation of software source code into a hardware language. Development application 210 may implement various features, such as interface 220, editor 230, compiler 240, and learned constraints and hardware feature information 250, which may be used to perform various interactive compilation techniques.

For example, interface 220 may be a programmatic interface implementing one or multiple Application Programming Interfaces (APIs) to invoke different operations, including compilation, a GUI interface that provides various visual control elements for editing, compiling, or other development activities, and/or a command line interface, which may also provide command line controls to edit, compile, or perform other development activities. In some embodiments, interface 220 may act as a control console that allows for the configuration of development application 210 features. For instance, interface 220 may support requests to configure various parameters or options of compiler 240, such as the target hardware language, configure or adjust the constraints or considerations for formal verification systems (used as discussed below). Like FIG. 4 below, interface 220 may provide input support for editing code, both source code and intermediate code generated as part of the compilation process.

Editor 230 may support various operations to add, remove, change, copy, search, replace, view, or otherwise interact with source code and intermediate code (e.g., as discussed below with regard to FIG. 4). Compiler 240, discussed in detail below with regard to FIG. 3, may implement various techniques to accept source code in a language that describes the software and transform the source code into a version in hardware language. Hardware feature information 250 may store various hardware design specifications, features, or other information, which may inform compiler 240 and editor 230. For instance, name or type mapping information for components may be maintained in hardware feature information so that editor 230 can label features (e.g., a graph of code instructions displayed).

In various embodiments, the components illustrated in FIG. 2 may be implemented directly within computer hardware, as instructions directly or indirectly executable by computer hardware (e.g., a microprocessor or computer system), or using a combination of these techniques. For example, the components of FIG. 2 may be implemented by a system that includes a number of computing nodes (or simply, nodes) as part of a service, each of which may be similar to the computer system embodiment illustrated in FIG. 8 and described below, in one embodiment. In various embodiments, the functionality of a given system or service component (e.g., a component of development application 210 may be implemented by a particular node or may be distributed across several nodes. In some embodiments, a given node may implement the functionality of more than one service system component (e.g., more than one development application component).

Figure 3:
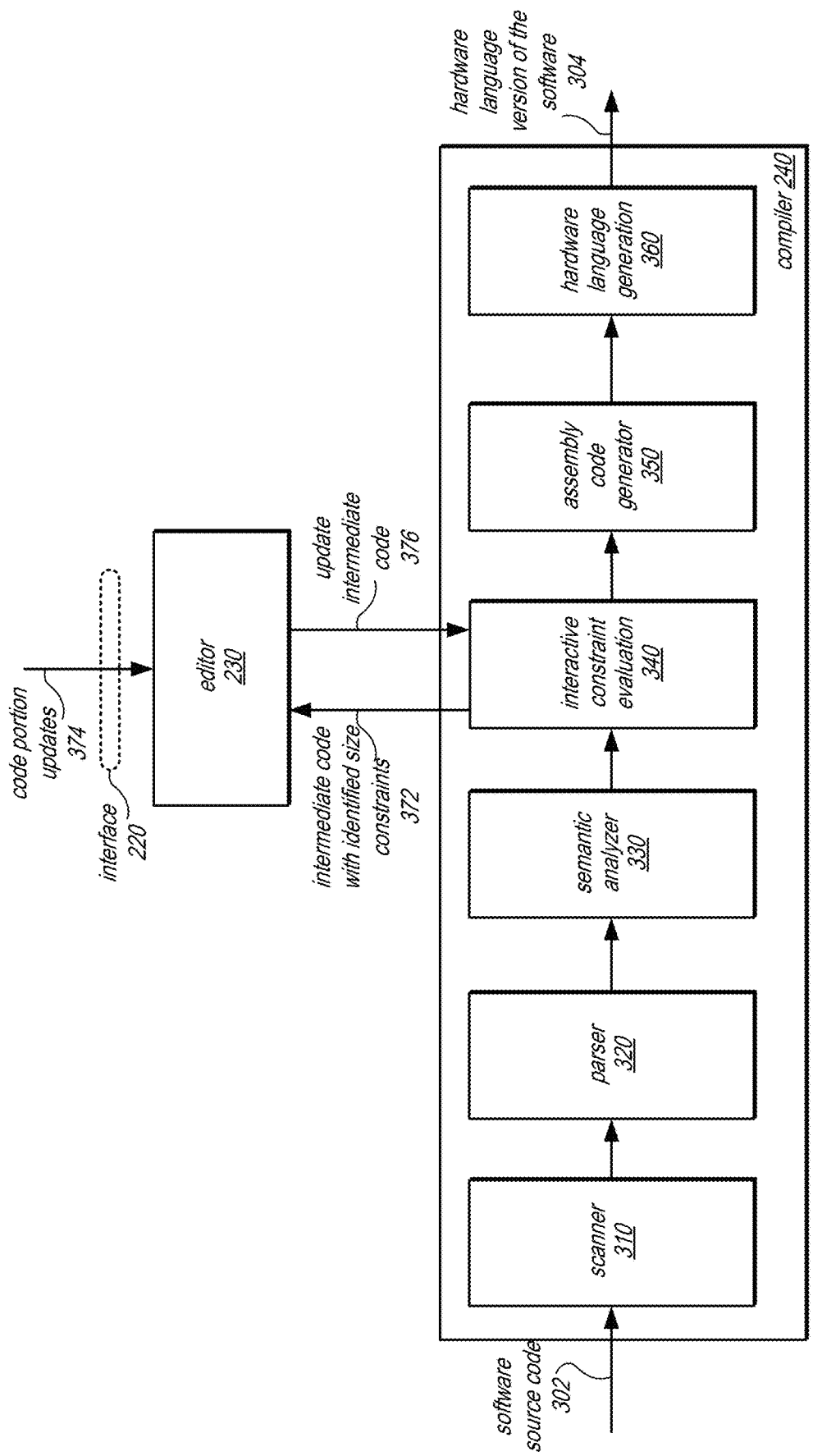
FIG. 3 is a logical block diagram illustrating a compiler that may implement interactive compilation of software to a hardware language to satisfy formal verification constraints, according to some embodiments.

FIG. 3 is a logical block diagram illustrating a compiler that may implement interactive compilation of software to a hardware language to satisfy formal verification constraints, according to some embodiments. Compiler 240 may implement various compilation stages to translate received software source code 302 into a hardware language version of the software 304. Compiler 240 may implement scanner 310 which may perform features such as lexical analysis to convert a stream of characters in the source code into a stream of tokens. Various operations to modify the stream for further processing, such as removing comments, whitespace, checking other structural features of the code like indentation, checking for case sensitive errors, identifying new lines, identifying unknown characters, for instance, may be performed by scanner 310.

Scanner 310 may provide a token stream to parser 320, in various embodiments. Parser 320 may generate a syntax tree or other representation of the tokens in order to structure the relationships between different operations, including cyclical or recursive relationships. The syntax tree may be annotated with various information, parameters, or features that describe the different tokens in the tree (e.g., annotating data types of parameters or variables).

Parser 320 may provide the annotated syntax tree to semantic analyzer 330. semantic analyzer may check the legality or validity of various relationships (e.g., checking references between tree nodes, checking for type mismatches, invalid parameters in function calls, data access violations, etc.). Semantic analyzer 330 may apply analytical rules specific to the language of the source code (e.g., C-based rules for source code written in C).

Interactive constraint evaluation 340 may generate an intermediate form of the code from the analyzed source code received from semantic analyzer 330. For example, operations represented in the syntax tree may be rewritten in a form that resembles the instructions of the target hardware language. In at least some embodiments, line numbers may be inserted into the assembly code version of the source code, which may indicate within the assembly code the location of a next operation (e.g., in the event of a jump or other move made as a result of a logical condition or operation). FIG. 5, discussed below, provides an example of intermediate assembly code that may be generated in some embodiments Interactive constraint evaluation 340 may perform various analyses to identify portions that may cause the translated code to fail to satisfy a constraint of a formal verification system. For instance, interactive constraint evaluation 340 may apply rules-based classifiers that may analyze different portions of the intermediate code for different types of features that could result in expansion of the intermediate code size when finally translated may be applied. Function calls, declarations, or invocations may be searched for (e.g., by ignoring key words, spacers, operators, or other known artifacts in the intermediate code) according to a rule that identifies unknown functions and/or functions of an unknown size (e.g., implemented by a library or other external data source which may expand the size of the intermediate code when added), in one example. Another example rule may identify logic conditions (e.g., by searching for if, else, or other logic operation statements) to determine whether a logic condition includes an unknown variable or feature that could result in an unknown expansion of the code. In some embodiments, all non-static parameters, features, variables, or values may be identified. In some embodiments known functions larger than certain size may be identified (e.g., in order to allow an editor to reduce the size with a custom implementation instead of a library-based implementation). Another rule may total the size of the intermediate code and then identify the largest operation, instruction, or feature within the intermediate code (e.g., again in order to allow an editor to reduce the size with a custom implementation instead of a library-based implementation).

Similar analyses may be performed for other types of constraints. For instance, searches for various features or functions not supported by a formal verification system may be implemented (e.g., using a white list or black list style evaluation of supported or unsupported functions). In some embodiments, data structures (e.g., sort trees or other complex structures) may be evaluated to determine whether a size, management logic (e.g., insertion, deletion, balancing operations for a tree) or other data structure support features can be modeled by a formal verification system. In some embodiments, a time-based constraint may identify sets of operations that while simple enough to be modeled when viewed individually are included or performed in such large numbers as to exceed a modeling time limit.

In addition to (or instead of) classification rules, as discussed above, constraint evaluation may implement various learning models to recognize or otherwise identify portions of intermediate code that may cause a compiled version of the source code to not satisfy formal verification system constraints. For example, if an edit is received to update one portion of code (e.g., an edit to substitute a variable with an actual value), then that update may be applied automatically to other portions in the intermediate code where the update occurs. In some embodiments, an update may be classified (e.g., a function update or a logic update), which may be used to identify different but other functions or logics that may also need to be updated. As noted above with regard to FIG. 2, these various learned constraints or other hardware features may be updated and provided to interactive constraint evaluation 340 (not illustrated).

Interactive constraint evaluation 340 may provide the intermediate code 372 with identified constraints to editor 230 for display to a user via interface 220. In some embodiments, the intermediate code may be provided without indications of possible constraint error conditions. As discussed below with regard to FIG. 4, portions of the intermediate code may be changed, updated, expanded, or deleted. These code portion updates 374 may be provided 376 by editor 230 to interactive constraint evaluation 340, which may update the intermediate code. In some embodiments, interactive constraint evaluation 340 may check updates for correctness, or other errors that would have been identified by an earlier compiler stage (e.g., semantic analysis). In some embodiments, interactive constraint evaluation 340 may prompt via editor 230 for further information to perform additional analysis of the intermediate code.

Assembly code generator 350 may generate an assembly code version of the source code using the updates received at interactive constraint evaluation 340. For instance, for those portions of the source code that are replaced (e.g., a function call) with different instructions, the generated assembly code may reflect only the replaced portion of the code (e.g., instructions to perform an invoked operation or logic of a function).

Hardware language generator 360 may accept the generated assembly code and perform various operations to complete the generation of the hardware language version of the software 304. For example, an operation that is described by one instruction in the assembly code may be broken into multiple different instructions to accomplish the same operation.

Figure 4:
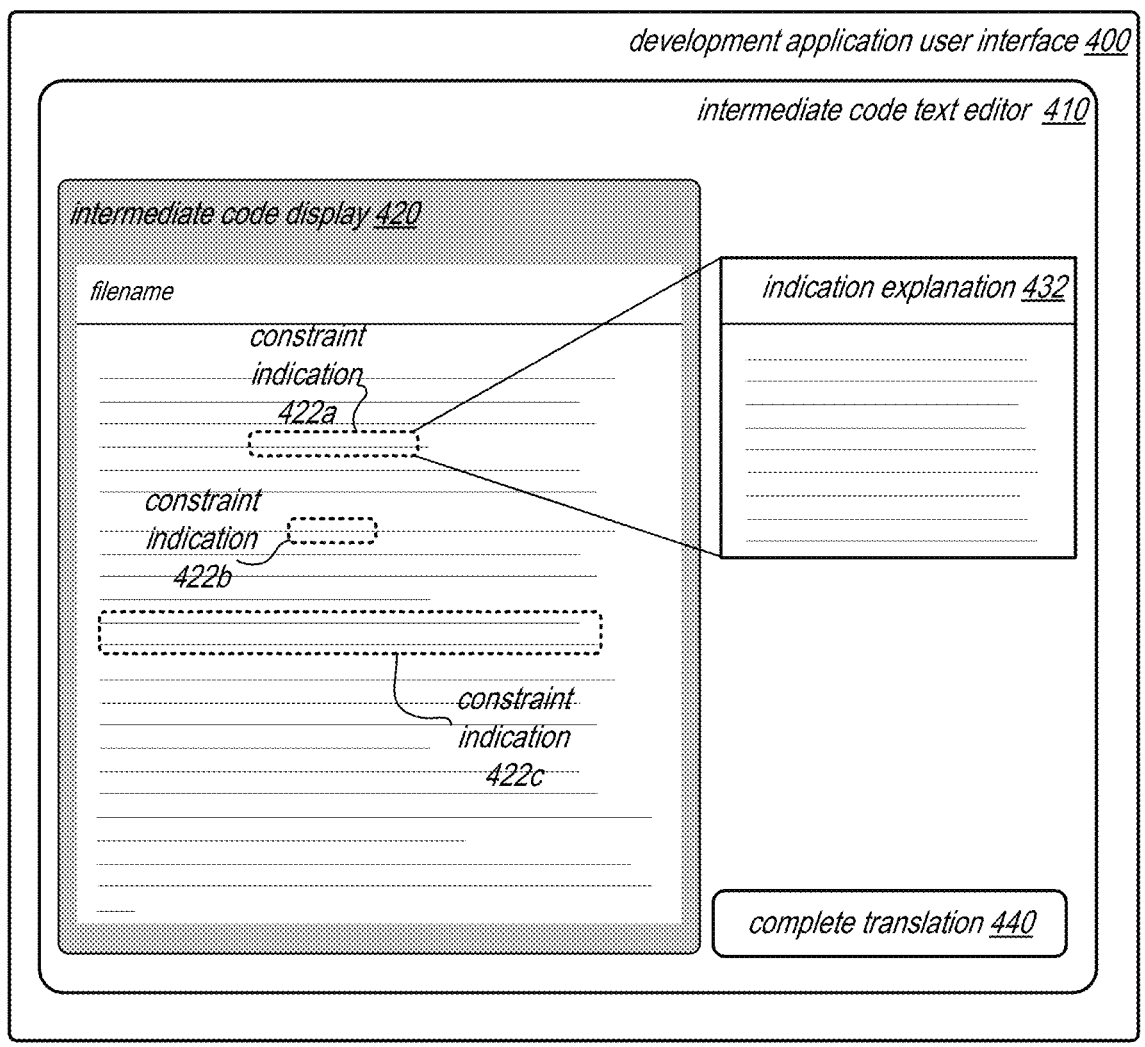
FIG. 4 is an example graphical user interface for the development application for updating portions of intermediate code, according to some embodiments.

FIG. 4 is an example graphical user interface for the development application for updating portions of intermediate code, according to some embodiments.

Development application user interface 400 may be a GUI that allows a user various controls or options to interact with development application 210. For instance, development application user interface 400 may implement various menus and other graphical user interface elements to allow a user to identify a source code file, perform edits to the source file, begin compilation, perform edits to intermediate code (as illustrated) and complete the translation 440.

In order to provide a dynamic compilation, development application user interface 400 may implement intermediate code text editor 410 (which may be similar to editor 230 discussed above in FIG. 3). Intermediate code display 420 may provide a display area for a software undergoing translation by the compiler 240. The filename or other indicator of the source code may be provided along with the text of the intermediate code as generated. In some embodiments, display area 420 may be selectable via various input devices (e.g., mouse, keyboard, touch screen, etc.) in order to view and manipulate intermediate code.

As discussed below with regard to FIG. 7, in some embodiments, indications of code portions, like indications 422a, 422b, and 422c, may be provided for code that could cause a constraint for a formal verification system to not be satisfied. One of the indications, like indication 422a may be selected, so that indication explanation 432 may be display. Indication explanation may identify why (e.g., what rule) triggered the identification of the code portion. In some embodiments, a suggested edit may be displayed (e.g., a change to an address value instead of a reference). In some embodiments, multiple prompts may be displayed (not illustrated) to gather further information to determine whether other constraint indications should be provided and to ascertain whether the same update should be applied to other portions of the intermediate code that match the identified constraint as part of a learning feature for intermediate code text editor. In some embodiments, warnings about the costs incurred by not editing an indication portion (e.g., a portion may be indicated as implicating 100 lines of hardware language code if not edited). When a user is finished editing, complete transaction element 440 may be selected to send a request to complete translation of the source code using the specified updates.

In some embodiments, an update entered for an identified constraint 422 (or another portion of the code not identified) may cause a revaluation of the intermediate code, as discussed below with regard to FIG. 7. If, for instance, an update may worsen the compilation with regard to the constraint (e.g., make the compiled code grow larger in further excess of a size constraint) or cause failure of a different constraint, a new constraint indication may be displayed. As a result of the learning techniques for recognizing constraints discussed above with regard to FIG. 3, updates made in response to some constraint indications may trigger recognition of additional portions of intermediate code that should also be displayed and possibly updated by a user. In some embodiments, automated updates (e.g., made in response to a user submitted update) may be indicated via intermediate code display (not illustrated).

FIG. 5 is an example of a translation from a source code of software to an intermediate code version of the software code, according to some embodiments. Software source code 510 illustrates an example of source code that may be received and translated (e.g., compiled) to a hardware language. Intermediate assembly code 530 illustrates an example of intermediate code that may be generated 520 from software source code 510. Line numbers may be inserted, as illustrated at 530, to identify the location of a next instruction in the logic, in some embodiments. In this way, the location of an instruction to be performed based on a logical condition may be quickly identified. As another example, features such as function invocations like "gic_read_iar( )" may be candidates for editing, as may be conditional logic within if statements, address values identified by name and not physical reference, among other edits that could be made.

The examples of a compiler as discussed above with regard to FIGS. 1-5 have been given in regard to an example compiler implemented as part of a development application. Note that various other types or configurations of compilers or development applications may implement interactive compilation of software to a hardware language to satisfy formal verification constraints and thus may implement these techniques. In addition to examples given above, the techniques discussed below with regard to FIGS. 6-7 may be also implemented using the various components discussed above as well as different types of systems or devices that compile source code for software to be executed on a hardware design.

Figure 6:
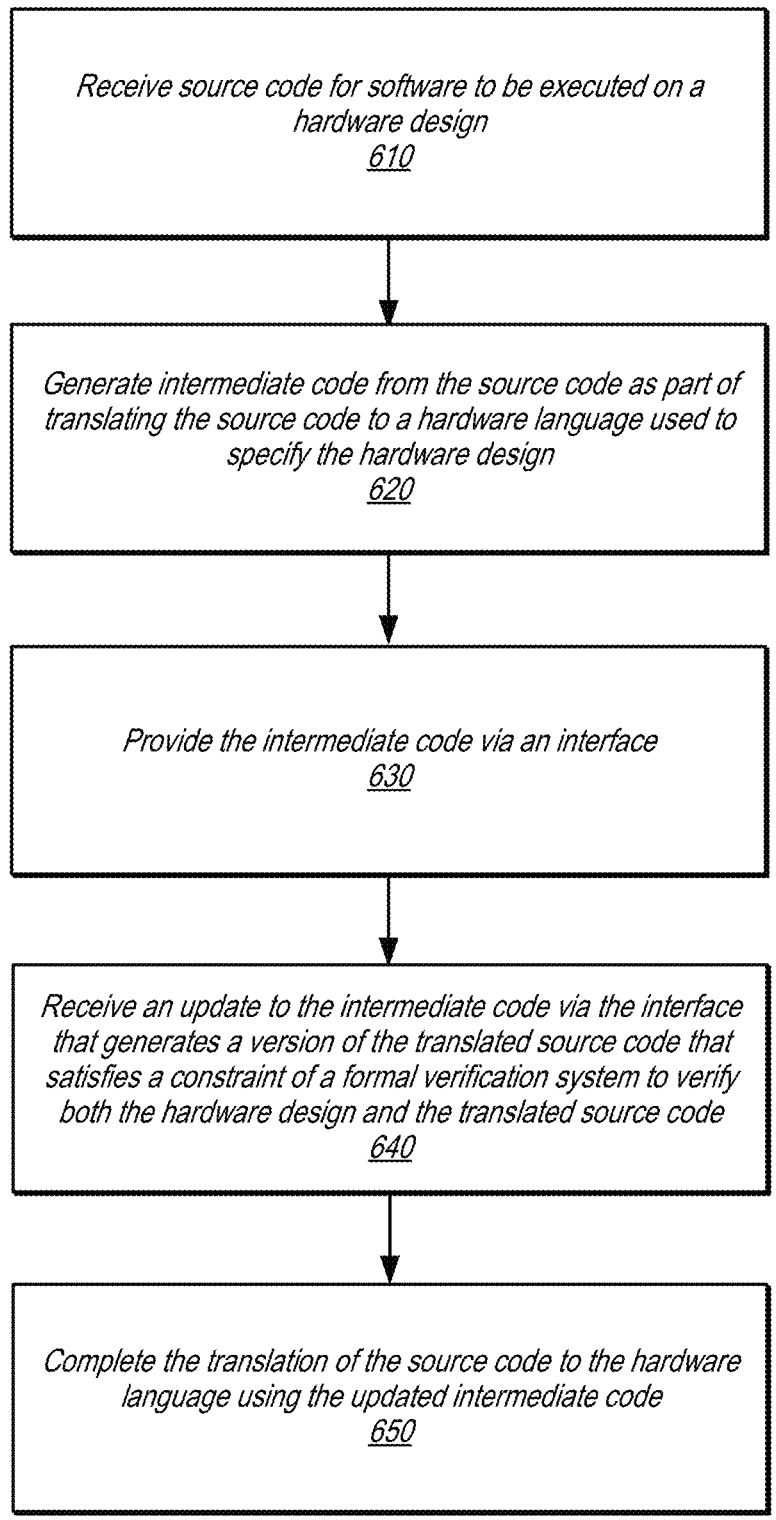
FIG. 6 is a high-level flowchart illustrating various methods and techniques to implement interactive compilation of software to a hardware language to satisfy formal verification constraints, according to some embodiments.

FIG. 6 is a high-level flowchart illustrating various methods and techniques to implement interactive compilation of software to a hardware language to satisfy formal verification constraints, according to some embodiments. As indicated at 610, source code may be received for software to be executed on a hardware design, in some embodiments. For instance, a storage system, file system, or other storage technology may accept the writing, copying, or storing of source code for the software. In some embodiments, source code may be received directly via an interface (e.g., source code that is entered into a text editor or other text input interface). The source code may be specified in various software programming languages (e.g., C, C++, Rust, Python, etc.), which may be compiled on a different compiler (than the hardware language compiler) for execution on the hardware design when the hardware design is implemented in circuitry (e.g., a C compiler that targets the implemented hardware design to implement machine code instructions).

As indicated at 620, intermediate code may be generated from the code as part of translating the source code to a hardware language used to specify the hardware design, in some embodiments. If, for example, the hardware design is specified according to a hardware language like System Verilog or VHSIC Hardware Definition Language (VHDL), then the intermediate code may be generated as part of translating the source code to System Verilog (or VHDL). The formal verification system may accept as a single verification task, job, or operation, System Verilog code so that if both the hardware design and the software were implemented in System Verilog, the formal verification system could perform verification on both the software and hardware design together. Intermediate code may be assembly code (or partial assembly code), in some embodiments. As noted above with regard to FIG. 3, operations such as scanning, parsing, and analyzing may be performed in order to generate the intermediate code.

As indicated at 630, the intermediate code may be provided via an interface, in some embodiments. For instance, like the GUI interface discussed above with regard to FIG. 4, the intermediate code may be displayed in a text editable interface, in some embodiments. In some embodiments, the intermediate code may be written to or stored in a location accessible to editing tools or other applications that may provide access to the intermediate code.

As indicated at 640, an update to the intermediate code may be received via the interface that generates a version of the translated code that satisfies a constraint of a formal verification system to verify both the hardware design and the translated source code, in some embodiments. For example, as discussed above with regard to FIG. 1, a formal verification system may be unable to perform verification techniques upon input data where a combined size of the hardware design specified in hardware language and the translated software in hardware language may have to be less than X MB in order to perform formal verification, less than Y lines of code, and/or less than Z number of flip-flops, latches and/or logic gates. In some embodiments, size of the combined hardware and translated software for formal verification may be determined according to the content (e.g., operations) in the code. For example, certain operations may be unable to be verified because their expanded representation within a formal model would exceed the capabilities of the formal verification system to analyze. In other examples, the updates may replace functions, features, or data structures which, for instance, are not easily detected and/or extremely inefficient software constructs by a formal verification system and thus do not satisfy a constraint of the supported features of the formal verification system.

The update may change various features of the intermediate code, such as replacing function identifiers with literals or other portions of intermediate code to implement the function. In some embodiments, the values in a operation (e.g., the values to write/store to registers) or the location of an operation (e.g., where to read or write values to in registers) may be an update.

As indicated at 650, translation of the source code to the hardware language may be completed using the updated intermediate code, in some embodiments. For example, the updated portions of the intermediate code may implement or support all of the features in the intermediate code without supplementing the intermediate code with further information (e.g., data structures, instructions from libraries, or any other information that would expand the of the code). Various mappings, reformatting, expansion, or other techniques may be performed to complete the translation of the source code to the hardware language, using the updated portions of the intermediate code instead of the originally generated portions of the intermediate code to complete the translation of the source code to the hardware language.

Dynamic interactions to complete translation of source code may be supported so that the translated source code satisfies constraints of a formal verification system. FIG. 7 is a high-level flowchart illustrating various methods and techniques to implement provide indications of code portions to update via an interface, according to some embodiments. As indicated at 710, intermediate code generated as part of translating source code to a hardware language for code portions that could cause the translated source code to fail to satisfy a constraint for a formal verification system. For example, rules-based classifiers may analyze different portions of the intermediate code for different types of features that could result in expansion of the intermediate code when finally translated may be applied. For instance, function calls, declarations, or invocations may be searched for (e.g., by ignoring key words, spacers, operators, or other known artifacts in the intermediate code) according to a rule that identifies unknown functions and/or functions of an unknown (e.g., implemented by a library or other external data source which may expand the size of intermediate code when added).

Another example rule may identify logic conditions (e.g., by searching for if, else, or other logic operation statements) to determine whether a logic condition includes an unknown variable or feature that could result in an unknown expansion of the code. In some embodiments, all non-static parameters, features, variables, or values may be identified. In some embodiments known functions larger than certain may be identified (e.g., in order to allow an editor to reduce the size with a custom implementation instead of a library-based implementation). Another rule may total the size of the intermediate code and then identify the largest operation, instruction, or feature within the intermediate code (e.g., again in order to allow an editor to reduce the size with a custom implementation instead of a library-based implementation). Other rules may apply classifications or search functions to identify portions of code that implement data structures, functions, or other not that are not easily detected and/or inefficient (or particular versions or invocations of such data structures or functions that are not easily detected or not efficiently implement, such as a function that takes an unsupported data type as input parameter even though the function logic itself may be supported). For example, a rule may identify a real number translation, operations and/or comparisons between real numbers and binary numbers (or binary operators), in some embodiments.

As discussed above with regard to FIGS. 3 and 4, learning-based evaluations may be implemented to recognize portions of intermediate code based on the updates received for other portions of intermediate code. For example, a pattern or combination of operations may be identified as problematic for satisfying formal constraints by tracking and evaluating received updates for intermediate code (e.g., operation B is always updated after an update to operation A). In some embodiments, various confidence measures may be generated for code portions recognized as potentially failing verification constraints so that high confidence code portions (e.g., above a confidence value threshold) may be automatically updated where as low confidence portions (below a confidence value threshold) may be identified to a user via an interface or not identified at all.

One portion of the intermediate code that could cause the translated source code to exceed the constraint for the formal verification system may be identified, as indicated at 720, in some embodiments. An indication may be provided via interface to update the code portion. For instance, as discussed above with regard to FIG. 4, various visual cues in a GUI interface may be implemented. In some embodiments, a report or other listing of indications to update code portions may be generated and stored or sent to an accessible location. In some embodiments, automatic updates may be performed to with tracking information to indicate the changes, which can then be undone or modified by a user via the interface (e.g., modify a variable mapping to a different address value).

The evaluation, identification and indication providing can be performed dynamically to interact with updates to the intermediate code as they are made or as new portions to indicate are discovered, in various embodiments. For example, if more portions of the code remain to be evaluated (which may include updated portions that were previously identified at 720), as indicated by the positive exist from 740, then another round of evaluation, identification and/or indication may be performed. For example, if the update is discovered to cause a size constraint concern, then the updated portion of code may be indicated at 730. In another example, an update could implicate new features or variables that could possibly cause the intermediate code to exceed the size constraint and an indication may be provided warning that the update made could increase the likelihood that a formal verification system would not accept the translated code for verification. Dynamic updates and analysis may continue until a request to complete translation is received, as indicated by the positive exit from 750, then dynamic compiling interactions may end, in some embodiments.

Various ones of the methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Boundaries between various components and operations are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of embodiments as defined in the claims that follow.

Figure 8:
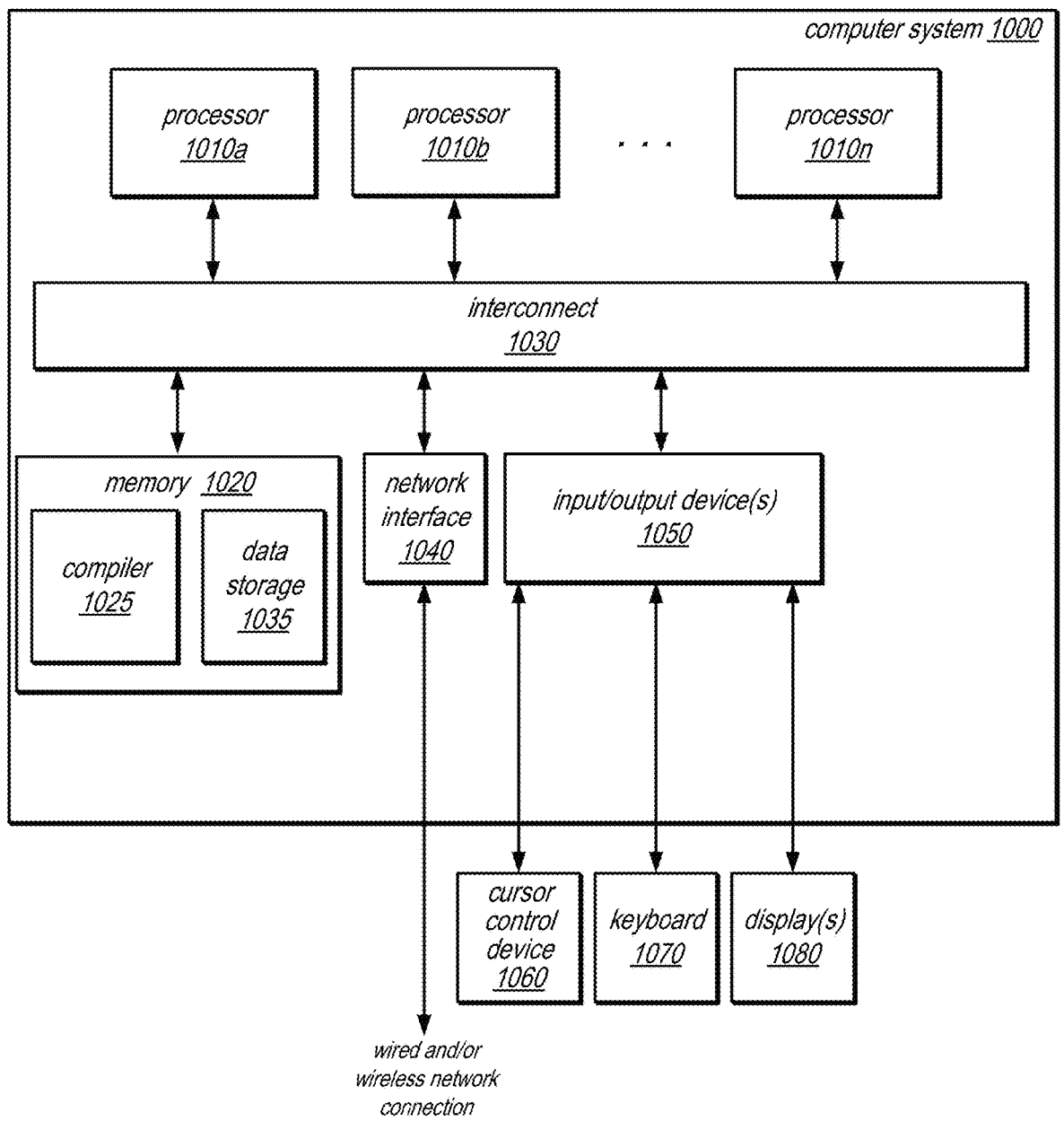
FIG. 8 is an example computer system, according to some embodiments.

Embodiments of interactive compilation of software to a hardware language to satisfy formal verification constraints as discussed above may be implemented as part of a computer system. One such computer system is illustrated by FIG. 8. In different embodiments, computer system 1000 may be any of various types of devices, including, but not limited to, a personal computer system, desktop computer, laptop, notebook, or netbook computer, mainframe computer system, handheld computer, workstation, network computer, a camera, a set top box, a mobile device, a consumer device, video game console, handheld video game device, application server, storage device, a peripheral device such as a switch, modem, router, or in general any type of computing node, compute node, computing device, compute device, or electronic device.

In the illustrated embodiment, computer system 1000 includes one or more processors 1010 coupled to a system memory 1020 via an input/output (I/O) interface 1030. Computer system 1000 further includes a network interface 1040 coupled to I/O interface 1030, and one or more input/output devices 1050, such as cursor control device 1060, keyboard 1070, and display(s) 1080. Display(s) 1080 may include standard computer monitor(s) and/or other display systems, technologies or devices. In at least some implementations, the input/output devices 1050 may also include a touch- or multi-touch enabled device such as a pad or tablet via which a user enters input via a stylus-type device and/or one or more digits. In some embodiments, it is contemplated that embodiments may be implemented using a single instance of computer system 1000, while in other embodiments multiple such systems, or multiple nodes making up computer system 1000, may host different portions or instances of embodiments. For example, in one embodiment some elements may be implemented via one or more nodes of computer system 1000 that are distinct from those nodes implementing other elements.

In various embodiments, computer system 1000 may be a uniprocessor system including one processor 1010, or a multiprocessor system including several processors 1010 (e.g., two, four, eight, or another suitable number). Processors 1010 may be any suitable processor capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 1010 may commonly, but not necessarily, implement the same ISA.

In some embodiments, at least one processor 1010 may be a graphics processing unit. A graphics processing unit or GPU may be considered a dedicated graphics-rendering device for a personal computer, workstation, game console or other computing or electronic device. Modern GPUs may be very efficient at manipulating and displaying computer graphics, and their highly parallel structure may make them more effective than typical CPUs for a range of complex graphical algorithms. For example, a graphics processor may implement a number of graphics primitive operations in a way that makes executing them much faster than drawing directly to the screen with a host central processing unit (CPU). In various embodiments, graphics rendering may, at least in part, be implemented by program instructions that execute on one of, or parallel execution on two or more of, such GPUs. The GPU(s) may implement one or more application programmer interfaces (APIs) that permit programmers to invoke the functionality of the GPU(s). Suitable GPUs may be commercially available from vendors such as NVIDIA Corporation, ATI Technologies (AMD), and others.

System memory 1020 may store program instructions and/or data accessible by processor 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing desired functions, such as those described above are shown stored within system memory 1020 as program instructions, such as program instructions to implement a compiler 1025 (like compiler 240 discussed above with regard to FIG. 2 as well as other features or all of development application 210) and data storage 1035, respectively. In other embodiments, program instructions and/or data may be received, sent or stored upon different types of computer-accessible media or on similar media separate from system memory 1020 or computer system 1000. Generally speaking, a non-transitory, computer-readable storage medium may include storage media or memory media such as magnetic or optical media, e.g., disk or CD/DVD-ROM coupled to computer system 1000 via I/O interface 1030. Program instructions and data stored via a computer-readable medium may be transmitted by transmission media or signals such as electrical, electromagnetic, or digital signals, which may be conveyed via a communication medium such as a network and/or a wireless link, such as may be implemented via network interface 1040.

In one embodiment, I/O interface 1030 may coordinate I/O traffic between processor 1010, system memory 1020, and any peripheral devices in the device, including network interface 1040 or other peripheral interfaces, such as input/output devices 1050. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. In addition, in some embodiments some or all of the functionality of I/O interface 1030, such as an interface to system memory 1020, may be incorporated directly into processor 1010.

Network interface 1040 may allow data to be exchanged between computer system 1000 and other devices attached to a network, such as other computer systems, or between nodes of computer system 1000. In various embodiments, network interface 1040 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1050 may, in some embodiments, include one or more display terminals, keyboards, keypads, touchpads, scanning devices, voice or optical recognition devices, or any other devices suitable for entering or retrieving data by one or more computer system 1000. Multiple input/output devices 1050 may be present in computer system 1000 or may be distributed on various nodes of computer system 1000. In some embodiments, similar input/output devices may be separate from computer system 1000 and may interact with one or more nodes of computer system 1000 through a wired or wireless connection, such as over network interface 1040.

Those skilled in the art will appreciate that computer system 1000 is merely illustrative and is not intended to limit the scope of the techniques as described herein. In particular, the computer system and devices may include any combination of hardware or software that can perform the indicated functions, including a computer, personal computer system, desktop computer, laptop, notebook, or netbook computer, mainframe computer system, handheld computer, workstation, network computer, a camera, a set top box, a mobile device, network device, internet appliance, PDA, wireless phones, pagers, a consumer device, video game console, handheld video game device, application server, storage device, a peripheral device such as a switch, modem, router, or in general any type of computing or electronic device. Computer system 1000 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a non-transitory, computer-accessible medium separate from computer system 1000 may be transmitted to computer system 1000 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Accordingly, the present invention may be practiced with other computer system configurations.

Various modifications and changes may be made as would be obvious to a person skilled in the art having the benefit of this disclosure. It is intended that the invention embrace all such modifications and changes and, accordingly, the above description to be regarded in an illustrative rather than a restrictive sense.

What is claimed is:

1. A system, comprising:
a processor;
a memory, storing program instructions that when executed by the processor cause the processor to implement a compiler, wherein the compiler is configured to:
receive, via an interface, a request to compile source code for embedded software to be executed on a hardware design;
responsive to the receipt of the request:
generate intermediate code from the source code as part of compiling the source code to a hardware language used to specify the hardware design;
display the intermediate code via the interface;
receive an update to the intermediate code via the interface that generates a compiled version of the source code that satisfies a constraint of a formal verification system to verify both the hardware design and the compiled version of the source code; and
complete the compilation of the source code to the hardware language using the updated intermediate code.

2. The system of claim 1, wherein the compiler is further configured to:
evaluate the intermediate code to identify one code portion that could cause the compiled source code to fail to satisfy the constraint of the formal verification system; and
provide, via the interface, an indication to update the identified code portion.

3. The system of claim 2, wherein the indication of the identified code portion includes a suggested edit to the code portion.

4. The system of claim 1, wherein the update to the intermediate code includes an address value at the hardware design to perform an operation.

5. A method, comprising:
receiving source code for software to be executed on a hardware design;
generating intermediate code from the source code as part of translating the source code to a hardware language used to specify the hardware design;
providing the intermediate code via an interface;
receiving an update to the intermediate code via the interface that generates a translated version of the source code that satisfies a constraint of a formal verification system to verify both the hardware design and the translated version of the source code; and
completing the translating of the source code to the hardware language using the updated intermediate code.

6. The method of claim 5, wherein the method further comprises:
evaluating the intermediate code to identify one code portion that could cause the translated source code to fail to satisfy the constraint of the formal verification system; and
providing, via the interface, an indication to update the identified code portion.

7. The method of claim 6, wherein the identified code portion is a function call.

8. The method of claim 6, wherein evaluating the intermediate code to identify the one code portion that could cause the translated source code to fail to satisfy the constraint of the formal verification system comprises receiving one or more answers to one or more prompts provided via the interface.

9. The method of claim 5, wherein the method further comprises:
receiving, via the interface, another update to the intermediate code; and
providing, via the interface, an indication that the other update to the intermediate code could cause the translated source code to fail to satisfy the constraint of the formal verification system.

10. The method of claim 5, wherein the interface is a graphical user interface (GUI).

11. The method of claim 5, wherein generating the intermediate code from the source code comprises including line numbers in the intermediate code.

12. The method of claim 5, wherein the update to the intermediate code includes a value to write as part of an operation.

13. The method of claim 5, further comprising receiving a request to complete translating the source code to the hardware language after receiving the update, wherein the completing is performed in response to receiving the request to complete the translating.

14. One or more non-transitory, computer-readable storage media, storing program instructions that when executed on or across one or more computing devices cause the one or more computing devices to implement at least:
receiving, via an interface, a request to translate source code for software to be executed on a hardware design;
responsive to receiving the request:
generating intermediate code from the source code as part of translating the source code to a hardware language used to specify the hardware design;
providing the intermediate code via the interface;
receiving an update to the intermediate code via the interface that generates a translated version of the source code that satisfies a constraint of a formal verification system to verify both the hardware design and the translated version of the source code; and
completing the translating of the source code to the hardware language using the updated intermediate code.

15. The one or more non-transitory, computer-readable storage media of claim 14, wherein the one or more non-transitory, computer-readable storage media store further store instructions that when executed by the one or more computing devices cause the one or more computing devices to implement:
evaluating the intermediate code to identify one code portion that could cause the translated source code to fail to satisfy the constraint of the formal verification system; and
providing, via the interface, an indication to update the identified code portion.

16. The one or more non-transitory, computer-readable storage media of claim 15, wherein evaluating the intermediate code to identify the one code portion that could cause the translated code to fail to satisfy the constraint of the formal verification system is identified based on a prior update to a code portion received at the compiler.

17. The one or more non-transitory, computer-readable storage media of claim 15, wherein the one or more non-transitory, computer-readable storage media store further instructions that when executed by the one or more computing devices cause the one or more computing devices to implement receiving, via the interface, the constraint of the formal verification system.

18. The one or more non-transitory, computer-readable storage media of claim 15, wherein the identified code portion is an unknown variable.

19. The one or more non-transitory, computer-readable storage media of claim 14, wherein the update to the intermediate code includes specifying a logical condition to evaluate.

20. The one or more non-transitory, computer-readable storage media of claim 14, wherein the interface is a command line interface.

\* \* \* \* \*